United States Patent [19]

Colombo

[11] Patent Number: 4,553,022
[45] Date of Patent: Nov. 12, 1985

[54] EFFUSION CELL ASSEMBLY

[75] Inventor: Paul Colombo, New Brighton, Minn.

[73] Assignee: The Perkin-Elmer Corporation, Norwalk, Conn.

[21] Appl. No.: 616,743

[22] Filed: Jun. 4, 1984

[51] Int. Cl.⁴ ............................................. C23C 13/12
[52] U.S. Cl. .................................... 219/275; 219/390; 219/521; 118/726; 156/DIG. 103
[58] Field of Search ........................ 118/726, 727, 667; 156/DIG. 103, 611, 614; 219/271, 275, 272, 424, 426, 521, 553, 390

[56] References Cited

U.S. PATENT DOCUMENTS

| | | |
|---|---|---|
| 3,667,424 | 6/1972 | Cornelius et al. .............. 219/277 X |
| 3,839,084 | 10/1974 | Cho et al. ............................. 156/611 |
| 3,925,146 | 12/1975 | Olsen et al. ...................... 156/611 X |
| 4,239,955 | 12/1980 | Cho ...................................... 219/271 |
| 4,426,569 | 1/1984 | Miller et al. .......... 156/DIG. 103 X |
| 4,482,799 | 11/1984 | Princenski et al. ................. 219/275 |

FOREIGN PATENT DOCUMENTS 2066299  7/1981  United Kingdom .

OTHER PUBLICATIONS

Kubiak et al., "A Simple Source Cell Design for MBE", J. Vac. Sci. and Tech., vol. 20, pp. 252-253, 1982.
Norrman et al., "Highly Stabilized Evaporation Sources in a Water-Cooled Carousel Housing", J. Phys. E. Sci. Instrum., vol. 15, No. 7, Jul. 1982, pp. 731-735.

Primary Examiner—Norman Morgenstern
Assistant Examiner—Bernard F. Plantz
Attorney, Agent, or Firm—E. T. Grimes; J. D. Crane

[57] ABSTRACT

An effusion cell assembly includes a self-supporting element disposed within a housing member. The self-supporting element provides efficient heat transfer to a crucible positioned therein and permits operation at relatively lower filament tempertures.

2 Claims, 1 Drawing Figure

EFFUSION CELL ASSEMBLY

BACKGROUND OF THE INVENTION

The present invention generally relates to an effusion cell assembly and, in particular, relates to such an effusion cell assembly having a self-supporting filament.

In the general field of semiconductor manufacturing one of the most technologically sophisticated systems is known as the molecular beam epitaxial growth system (hereinafter referred to as MBE or MBE system). In very simplified terms an MBE system is one in which thermally excited atoms or molecules of one or more materials, for example, a semiconductor dopant, are produced in effusion cells and, as beams, bombard a semiconductor substrate. By bombarding a substrate in an accurate and selective fashion, well-defined layers of various compositions are formed on the substrates. These well-defined layers then serve as the essential structure for the fabrication of semiconductor devices. The thickness of these layers can, by, inter alia, a computer controlled mechanism, be very accurately controlled, thus resulting in well-defined structures. As those skilled in the semiconductor art will recognize, a critical factor in the fabrication of any semiconductor device on a substrate is the depth and composition of the dopant profile of the layered structure. Ideally, in most instances, the composition should be uniform throughout a particular layer. MBE systems appear capable of producing structures consisting of well-defined and abrupt interfaces. It is in furtherance of this goal that the present effusion cell assembly is directed.

As stated, one of the most critical components of an MBE system is the effusion cell assembly. In general, an effusion cell is the source of the atomic or molecular beam. Usually, a material is placed in the effusion cell assembly, which is effectively a crucible formed of a refractory material, and heated to a temperature at which a beam of atoms or molecules is emitted therefrom. The beam fluxes, i.e., the cross sectional density of atoms or molecules as well as the purity thereof impinging upon the substrate directly determines the composition growth rate for each molecular or atomic layer of the structure as well as the electrical characteristics thereof.

Although conceptually an MBE system appears straightforward, in actual practice many factors must be considered. For example, the materials used in the construction of the effusion cell assembly are critical because the cell is required to operate at rather high temperatures (about 1500° C.) and under an ultra high vacuum (usually about $10^{-10}$ Torr). Consequently, the materials chosen must be as free of impurities as possible to avoid out-gassing or decomposition, either of wich would severely contaminate the beam flux impinging on the semiconductor substrate.

The primary element of the effusion cell assembly is, of course, the filament which is electrically heated and radiantly heats the crucible in which the material to be evaporated is contained.

Conventional filaments for use in MBE effusion cell assemblies are rather complex arrangements and commonly use a tantalum wire, or ribbon, arranged on a pyrolytic boron nitride (pBN) support system. For example, one assembly involves weaving a tantalum wire through a plurality of perforated pBN discs. Another such assembly involves coiling a tantalum wire about a pBN tube. Although other assemblies are known, two known drawbacks are common to all such assemblies. First, tantalum filaments have a low emissivity and thus the required operating temperature of the filament is considerably higher than the crucible temperature. Second, such assemblies are inherently expensive due to the complex structure thereof.

SUMMARY OF THE INVENTION

Accordingly, it is one object of the present invention to provide an effusion cell assembly that, during operation, not only remains relatively cool externally but also provides efficient and uniform radiant heat transfer to the crucible.

This object is accomplished, at least in part, by an effusion cell assembly having a self-supporting filament as one element thereof.

Other objects and advantages will become apparent to those skilled in the art from the following detailed description read in conjunction with the appended claims and the attached drawing.

BRIEF DESCRIPTION OF THE DRAWING

The single FIGURE of the drawing is a partial cross-sectional view of an effusion cell assembly, not drawn to scale, embodying the principles of the present invention.

DETAILED DESCRIPTION OF THE INVENTION

Figure 1:
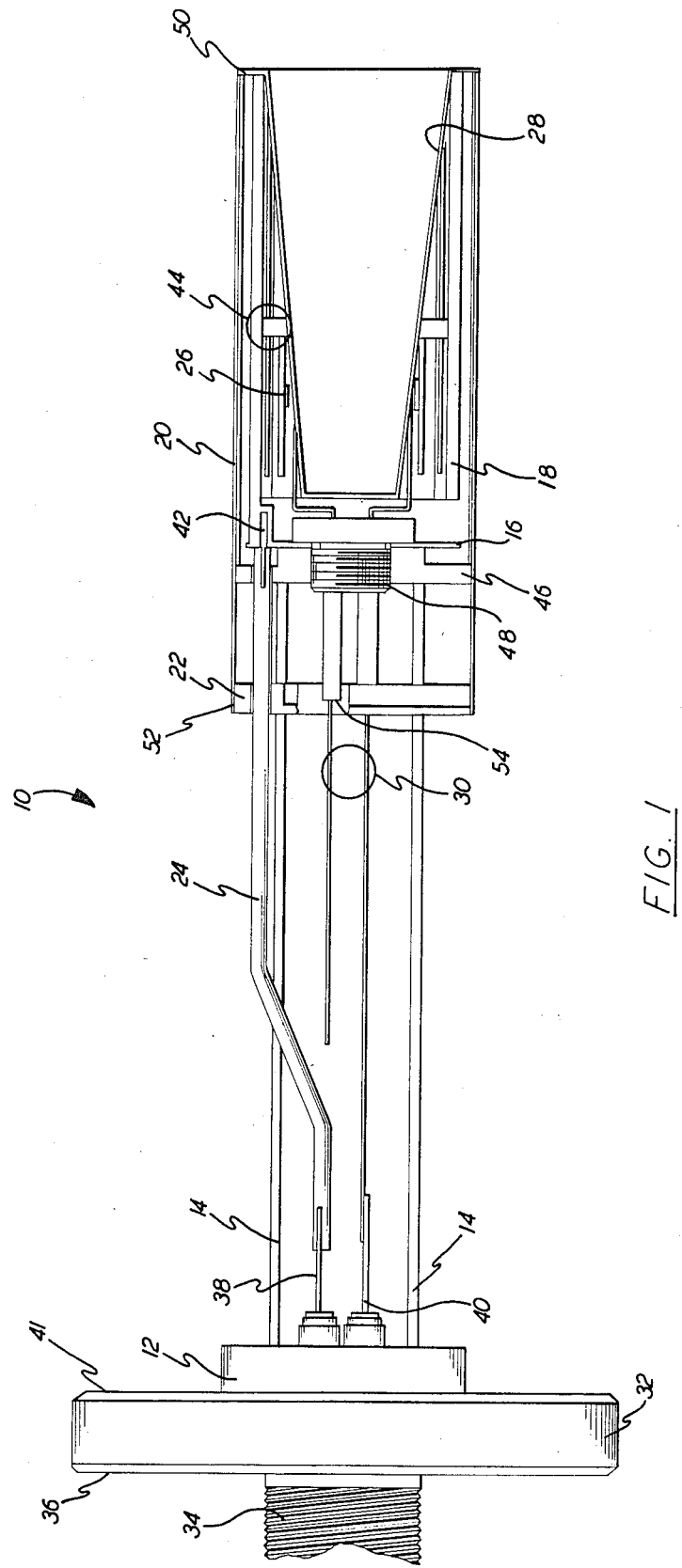

An effusion cell assembly, generally indicated at 10 in the FIGURE and embodying the priciples of the present invention, includes a base member 12 having a plurality of rigid standoffs 14 extending therefrom and supporting a filament seating member 16 upon which a self-supporting filament 18 is positioned. The assembly 10 further includes a filament housing 20 substantially completely surrounding the filament 18 and being closed by an end member 22 positioned between the base member 12 and the filament seating member 16. The assembly 10 includes a means 24 for providing an electrical connection to the filament 18. In addition, the assembly 10 preferably includes a temperature sensor 26 positioned between a crucible 28 and the filament 18 which temperature sensor 26 includes a plurality of temperature sensor leads 30 terminating at the base member 12.

In the preferred embodiment, the base member 12 includes a first segment 32 having a second externally threaded segment 34 extending from one surface 36 thereof distal the filament 18. The threaded segment 34 is preferably adapted to thread into a conventional MBE effusion cell electrical connector, not shown in the drawing. In addition, the base member 12 includes a plurality of heater lead pins 38 and a plurality of temperature sensor lead pins 40 extending therethrough and, in this embodiment, proturding from the second surface 41 of the segment 32. The heater leads 24 are electrically connected to the heater pins 38 and extend through the filament seating member 16 to make electrical contact with the self-supporting filament 18. Preferably, each contact between the heater leads 24 and the filament 18 is formed by means of a tantalum pin which is press fit into one of a pair of cooperatively sized heater lead receiving legs 42 of the filament 18.

The self-supporting filament 18 is hollow and, preferably, generally cylindrical in shape. The filament 18 includes a crucible support ridge 44 extending inwardly therefrom. The filament contact legs 42 extend from the general cylindrical shape and contact the filament seating member 16 which filament seating member 16 is insulatingly affixed to a filament base member 46 by means, for example, of a graphite bolt 48.

The filament housing 20 extends about the filament 18 and is spaced apart therefrom. In the preferred embodiment, the housing 20 is substantially coplanar with the filament 18 at one end 50 thereof and extends beyond the filament base member 48 at the other end 52 thereof. The housing 20 is closed at the end 52 thereof by means of a titanium end member 22 having a plurality of openings 54 therethrough through which the standoffs 14, the heater leads 24 and the thermocouple leads 30 extend. In the preferred embodiment, the self-supporting filament 18 is formed from graphite, although other materials may also be considered.

Preferably, the graphite filament 18 has a serpentine electrical path which is wrapped in the form of a cylinder. Such a serpentine path is preferably in order to provide the filament 18 with a practical ohmic resistance and to uniformly distribute the radiated heat about the crucible 28. That is, in operation, the temperature of the filament 18 is on the order of about 1500° C. with an operating amperage of about 20 amps and in order that the requisite voltage be practical, the resistance of the ffilament 18 must be adjusted accordingly. Consequently, it is preferred that the resistance of the filament 18 be on the order of about 2.3 ohms whereby a voltage of about 20 volts can be used as the operating voltage.

As shown in the FIGURE, the crucible 28, in operation, is positioned within the filament 18 and, because of the self-supporting capability of the filament 18, the filament 18 actually supports the crucible 28 therein not only at the one end 50 thereof but at an intermediate point therealong by means of the inwardly protruding support ridge 44. The support ridge 44 can be a continuous machined protrusion or, alternatively, and preferably, a plurality of individual protrusions. Consequently, a conventional additional crucible support is avoided and thereby the filament 18 radiates heat directly to the crucible 28 without loss due to crucible supports.

In the one specific embodiment, the filament 18 has a resistivity on the order of about $7 \times 10^4$ ohm inches, a generally cylindrical shape having a length on the order of about 9 centimeters and a diameter on the order of about 4 centimeters. The serpentine path has a width of about 0.4 centimeters and an unfolded length of about 12 centimeters. The threaded graphite bolt 48 has threads which are 5/8-11 UNC thread and secures the filament seating member 18 to the filament base member 46. The filament base member 46 is space apart from the titanium end member 22 of the housing 20 a distance on the order of about 2 centimeters and apart from the base member 12 on the order of about 14 centimeters.

Naturally, the above dimensions can be varied so that crucibles 28 of various sizes can be accommodated to provide a choice of beam flux and vary the extent of doping of a particular semiconductor surface.

The preferred material for the self-supporting filament 18 is graphite. Graphite is chosen primarily because of the available purity thereof as well as its relative high resistivity compared to the tantalum wire used in prior art supported coils. Consequently, the graphite filament 18 has a comparatively larger radiating area which more uniformly heats the crucible 28. Thus, for a given set of operating conditions, not only is the heat transferred to the crucible 28 more uniform but less heat is required from the filament 18 due to the fact that there is no loss between it and the crucible 28. As a result, the entire assembly 10 operates at a relatively lower temperature.

Although the present assembly has been described with respect to a specific embodiment, it will be understood that other arrangements and configurations may also be developed and as such the description herein is considered exemplary only. Therefore, the present invention is deemed limited only by the appended claims and the reasonable interpretation thereof.

What is claimed is:

1. An ultra-high vacuum effusion cell for operating at a temperature of about 1500° C. comprising, in combination:

a self supporting high emissivity heater filament having a serpentine path which is formed in a generally cylindrical configuration, said filament providing a substantially uniform radiation therefrom when electrical current passes therethrough;

a support ridge projecting inwardly of said heater filament and forming a support ring; and a crucible supported by said support ring and disposed radially inward of said heater filament to hold a material to be heated.

2. The assembly of claim 1 wherein said heater filament is made of graphite.

* * * * *